(12) United States Patent
Lee

(10) Patent No.: US 9,754,790 B2
(45) Date of Patent: Sep. 5, 2017

(54) MEMORY DEVICE AND METHOD FOR FABRICATING THE SAME

(71) Applicant: MACRONIX INTERNATIONAL CO., LTD., Hsinchu (TW)

(72) Inventor: Guan-Ru Lee, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/711,874

(22) Filed: May 14, 2015

(65) Prior Publication Data

US 2016/0336306 A1   Nov. 17, 2016

(51) Int. Cl.
*H01L 29/76* (2006.01)
*H01L 21/283* (2006.01)
*H01L 29/04* (2006.01)
*H01L 29/16* (2006.01)
*H01L 27/11582* (2017.01)

(52) U.S. Cl.
CPC ...... *H01L 21/283* (2013.01); *H01L 27/11582* (2013.01); *H01L 29/04* (2013.01); *H01L 29/16* (2013.01)

(58) Field of Classification Search
CPC . H01L 21/283; H01L 27/11582; H01L 29/04; H01L 29/16
See application file for complete search history.

(56) References Cited

U.S. PATENT DOCUMENTS

| 2011/0215394 A1* | 9/2011 | Komori | H01L 27/11573 257/324 |
| 2013/0161731 A1* | 6/2013 | Bin | H01L 29/78 257/329 |
| 2013/0228739 A1* | 9/2013 | Sasago | H01L 27/0688 257/4 |
| 2015/0131381 A1* | 5/2015 | Rhie | G11C 16/14 365/185.17 |
| 2015/0243672 A1* | 8/2015 | Kim | H01L 27/1157 257/324 |
| 2015/0340370 A1* | 11/2015 | Kim | H01L 27/1157 365/185.18 |

FOREIGN PATENT DOCUMENTS

| TW | 201515152 A | 4/2015 |
| TW | 201517242 A | 5/2015 |

OTHER PUBLICATIONS

TIPO Office Action dated Apr. 13, 2016 in Taiwan application (No. 104115496).

* cited by examiner

*Primary Examiner* — Su C Kim
(74) *Attorney, Agent, or Firm* — McClure, Qualey & Rodack, LLP

(57) ABSTRACT

A memory device comprises a patterned multi-layers stacking structure, a semiconductor capping layer, a memory layer and a channel layer. The patterned multi-layers stacking structure is formed on a substrate and has at least one trench used to define a plurality of ridge-shaped stacks comprising at least one conductive strip in the patterned multi-layers stacking structure. The semiconductor capping layer covers on the ridge-shaped stacks. The memory layer covers on sidewalls of the trench. The channel layer covers on the memory layer, the semiconductor capping layer and a bottom of the trench, wherein the channel layer is directly in contact with the semiconductor capping layer.

20 Claims, 14 Drawing Sheets

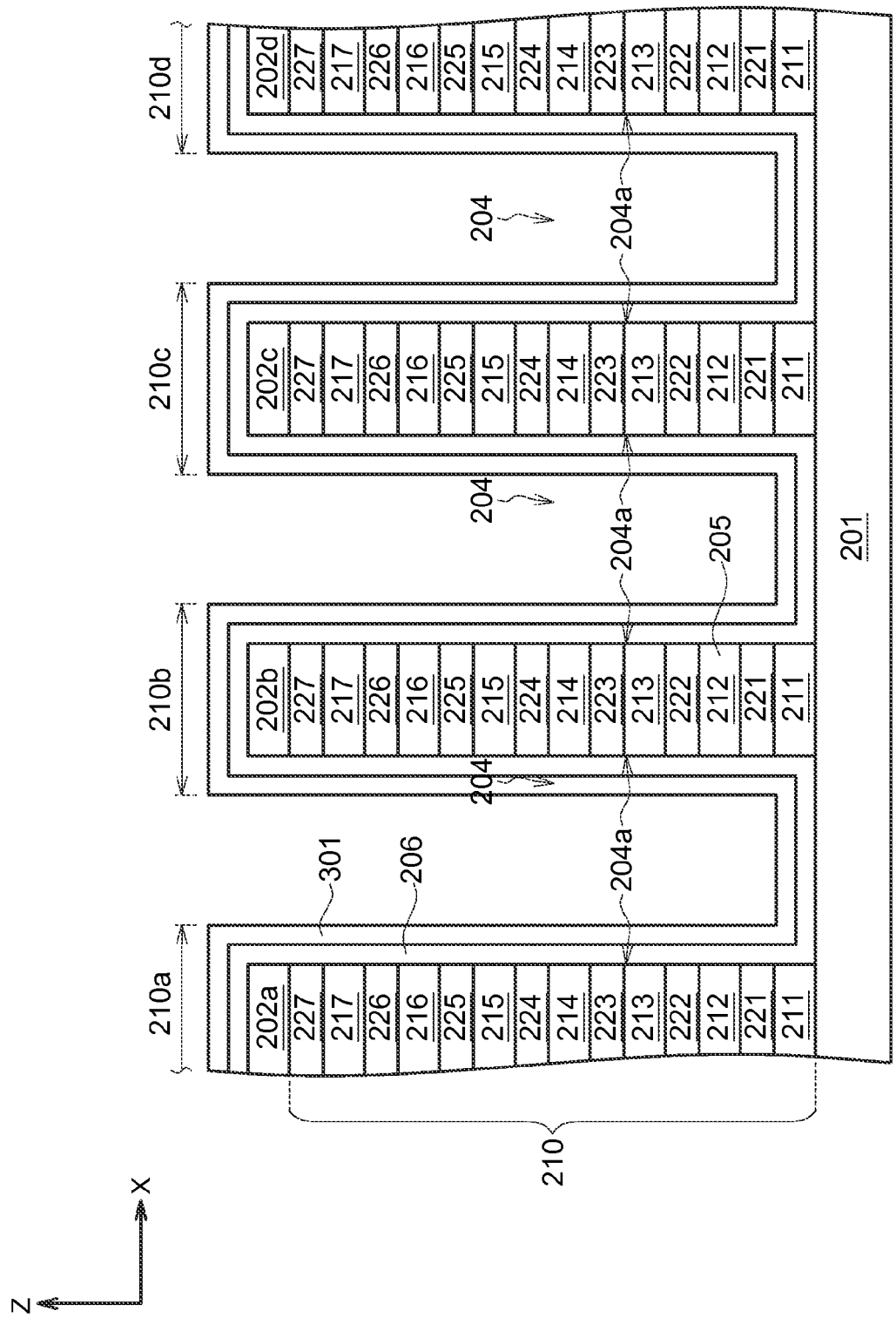

MEMORY DEVICE AND METHOD FOR FABRICATING THE SAME

BACKGROUND

Technical Field

The disclosure in generally relates to a semiconductor device and a method for fabricating the same, and more particularly to a three dimension (3D) memory device and a method for fabricating the same.

Description of the Related Art

Non-volatile memory (NVM) device which is able to continually store information even when the supply of electricity is removed from the device containing the NVM cell has been widely adopted by bulk solid state memory applications in portable audiovisual entertainment devices, cell phones or digital cameras etc. Recently, various three dimensional (3D) flash memory device, such as a vertical-channel (VC) 3D NAND flash memory device that has a multi-layers stacking structure, may possess a higher density memory and excellent electrical characteristics, e.g. reliability in data storage and high operating speed.

A 3D NVM device typically comprises a multi-layers stacking structure constituted by a plurality of insulation layers and a plurality of conductive layers alternatively stacked with each other. FIG. 1 is a cross-sectional view illustrating a multi-layers stacking structure 100 of a 3D NVM device in accordance with prior art. The multi-layers stacking structure 100 comprises a trench 101 used to divide the multi-layers stacking structure 100 into a plurality of ridge-shaped stacks 102 each of which comprises a plurality of conductive stripes 102a formed by the patterned conductive layers. The 3D NVM device further comprises a memory layer 103 and channel layer 104, wherein the memory layer 103 is disposed on sidewalls of the trench; the channel layer 104 covers on the ridge-shaped stacks 102 and the channel layer 104; and a plurality of memory cells 105 are defined at the positions where the conductive stripes 102a, the memory layer 103 and the channel layer 104 intersected with each other. The memory cells 105 that are electrically connected in series to form a vertical string electrical connection by the channel layer 104 are electrically connected to a corresponding bit line (not shown) through a metal contact 106 formed on the channel layer 104 overlaid on the ridge-shaped stacks 102.

In order to control the memory cells 105 more effectively, a thinner thickness of the channel layer 104 is required and the process window for forming the metal contact 106 on the channel layer 104 may be rather limited (or even not enough). Furthermore, a silicide layer (not shown) may be formed on the interface between a barrier layer of the metal contact 106 and the channel layer 104 that is typically made of poly silicon, and voids may easily occurs in the silicide layer due to thinner thickness of the channel layer 104. As a result the contact resistance of the metal contact 106 and the channel layer 104 may be increased significantly.

Therefore, there is a need of providing an improved memory device and a method for fabricating the same to obviate the drawbacks encountered from the prior art.

SUMMARY

One aspect of the present invention is to provide a memory device, wherein the memory device comprises a patterned multi-layers stacking structure, a semiconductor capping layer, a memory layer and a channel layer. The patterned multi-layers stacking structure is formed on a substrate and has at least one trench used to define a plurality of ridge-shaped stacks comprising at least one conductive strip in the patterned multi-layers stacking structure. The semiconductor capping layer covers on the ridge-shaped stacks. The memory layer covers on sidewalls of the trench. The channel layer covers on the memory layer, the semiconductor capping layer and a bottom of the trench, wherein the channel layer is directly in contact with the semiconductor capping layer.

According to another aspect of the present invention, a method for fabricating a memory device is provided, wherein the method comprises steps as follows: Firstly, a multi-layers stacking structure is provided on a substrate. A semiconductor capping layer is formed on the multi-layers stacking structure. Next, the multi-layers stacking structure and the semiconductor capping layer are patterned to form at least one trench, so as to form a plurality of ridge-shaped stacks each of which comprises at least one conductive strip. A memory layer is then formed covering on the semiconductor capping layer as well as covering on sidewalls and a bottom of the trench. Subsequently, portions of the memory layer disposed on the semiconductor capping layer and the bottom of the trench are removed. Thereafter, a channel layer is formed to cover the memory layer, the semiconductor capping layer and the bottom of the trench, whereby the channel layer is directly in contact with the semiconductor capping layer.

In accordance with the aforementioned embodiments of the present invention, a 3D memory device and a method for fabricating the same are provided. During the process for forming the 3D memory device, an additional semiconductor capping layer is firstly formed on a multi-layers stacking structure, and at least on trench is then formed to divide the semiconductor capping layer and the multi-layers stacking structure into a plurality of ridge-shaped stacks. Subsequently, a memory layer and a channel layer are formed in sequence to define a plurality of memory cells having a vertical string electrical connection on sidewalls of the trench, wherein the semiconductor capping layer is directly in contact with the channel layer.

Since the semiconductor capping layer can be integrated with the portion of the channel layer overlaying on top surfaces of the ridge-shaped stacks to form a contact area with a greater thickness, thus a greater process window can be provided allowing a metal contact subsequently formed thereon. Meanwhile, the contact area with greater thickness may provide more poly-silicon to form a silicide layer with smaller grains between the contact area and the metal contact, whereby void formed in the silicide layer may be prevented and the resistance between the metal contact and the channel layer may be decreased. In addition, because the semiconductor capping layer merely formed on the top surfaces of the ridge-shaped stacks, the integration of the semiconductor capping layer and the channel layer would not increase the channel thicknesses of the memory cells that are formed on the sidewalls of the trench. In other words, forming the semiconductor capping layer to provide a greater process window to the metal contact would not deteriorate the control efficiency of the 3D memory device.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 3A to 3E are cross-sectional views illustrating a method for fabricating a 3D NVM device in accordance with another embodiment of the present invention.

DETAILED DESCRIPTION

Figure 1:
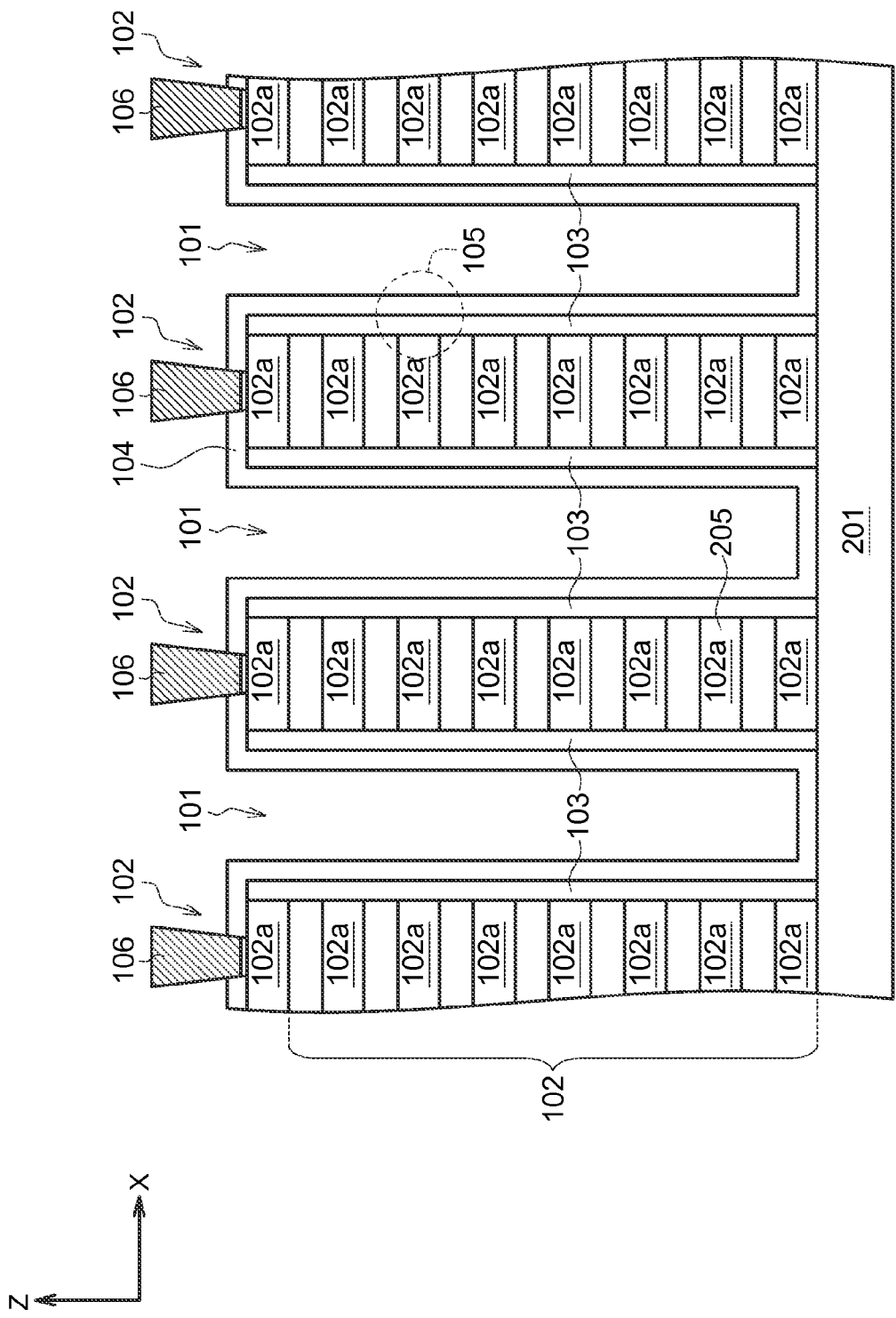
FIG. 1 is a cross-sectional view illustrating a multi-layers stacking structure of a 3D NVM device in accordance with prior art.

The embodiments as illustrated below provide a memory device and a method for fabricating the same to provide a greater process window for forming a metal contact, meanwhile to decrease the resistance thereof. The present invention will now be described more specifically with reference to the following embodiments illustrating the structure and method for fabricating the memory device.

It is to be noted that the following descriptions of preferred embodiments of this invention are presented herein for the purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

Figure 2:
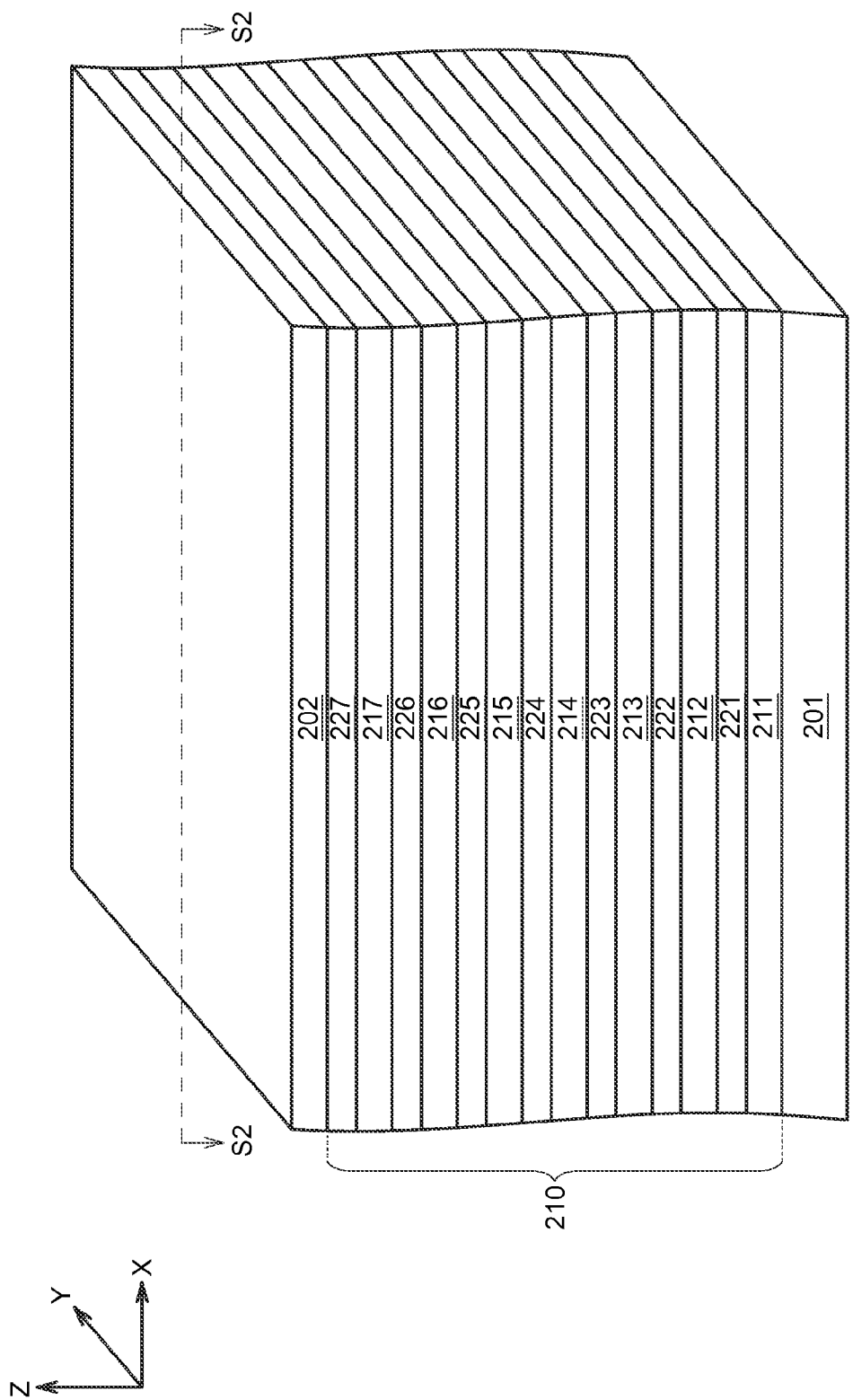
FIG. 2 is a cross-sectional view illustrating a multi-layers stacking structure of a 3D NVM device in accordance with one embodiment of the present invention.

The method for fabricating a 3D memory device 200 comprises steps as follows: A multi-layers stacking structure 210 is firstly provided on a substrate 201. FIG. 2 is a cross-sectional view illustrating a multi-layers stacking structure 210 of the 3D NVM device 200 in accordance with one embodiment of the present invention; and FIGS. 2A to 2G are cross-sectional views illustrating a method for fabricating a 3D NVM device performed on the structure depicted in FIG. 2 along a line S2.

In some embodiments of the present, the multi-layers stacking structure 210 comprises a plurality of conductive layers 211-217 and a plurality of insulation layers 221-227 formed on the substrate 201, wherein the conductive layers 211-217 and the insulation layers 221-227 are alternatively stacked on the substrate 201 vertically along a Z direction depicted in FIG. 2 and are parallel to each other . . . the insulation layer 227 serves as the top layer of the multi-layers stacking structure 210.

In some embodiments of the present invention, the conductive layers 211-217 may be made of metal materials, such as gold (Au), cupper (Cu), Aluminum (Al) or other suitable metal or alloy . . . . The insulation layers 221-227 may be formed of dielectric materials, such as silicon oxide, silicon nitride, silicon oxynitride, silicate, or others . . . the conductive layers 211-217 and the insulation layers 221-227 can be formed by a deposition process, . . . . The thickness of the insulation layers 221-227 may substantially range from 20 nm to 40 nm.

Figure 2A:
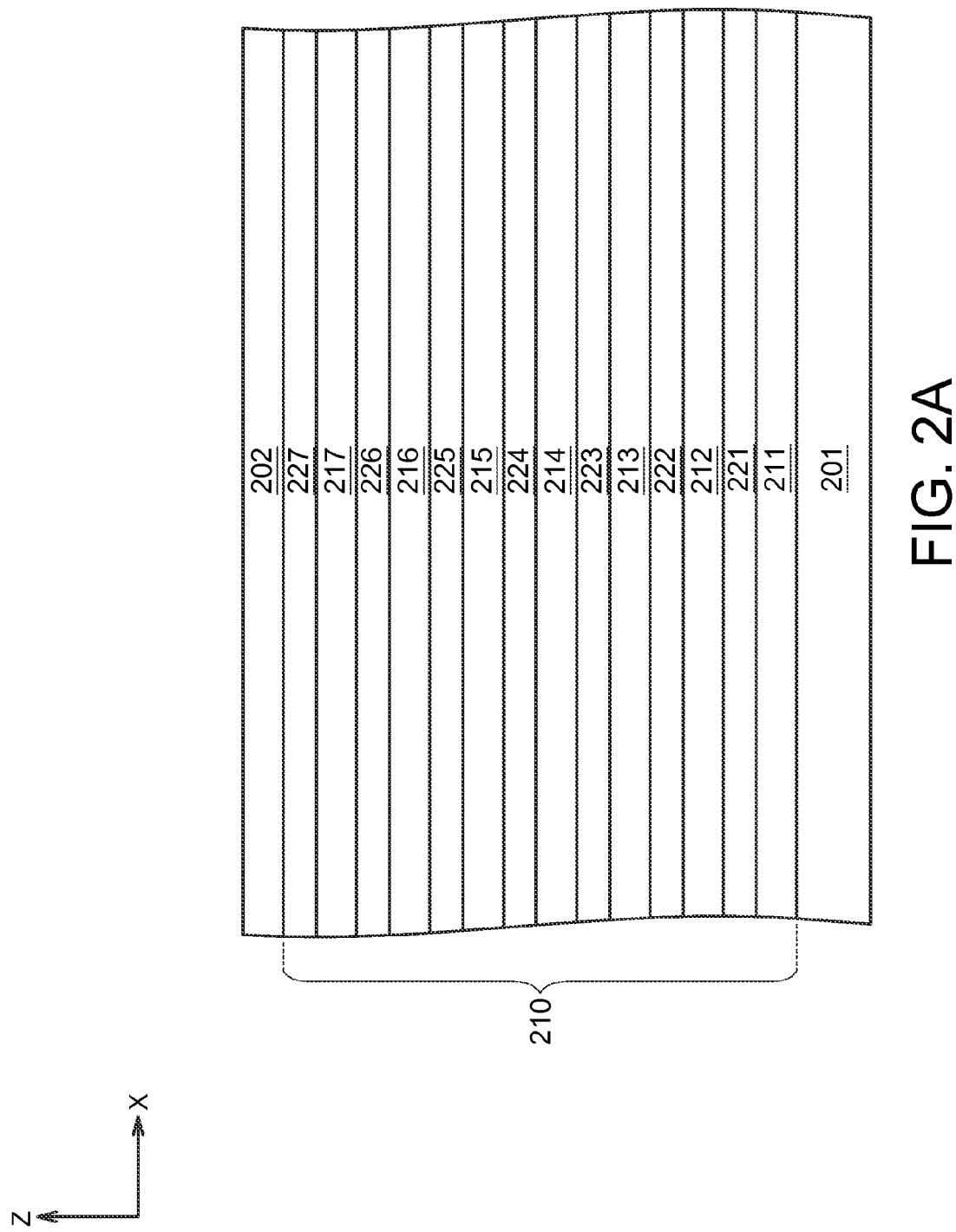
FIGS. 2A to 2G are cross-sectional views illustrating a method for fabricating a 3D NVM device performed on the structure depicted in FIG. 2 along a line S2.

Next, a semiconductor capping layer 202 is formed on the multi-layers stacking structure 210 (as shown in FIG.s and FIG. 2A). In the present embodiment, the semiconductor capping layer 202 is formed on the top-most insulation layer 227 of the semiconductor capping layer 202. In some embodiment, the semiconductor capping layer 202 is formed (but not limited) by an identical method that is used to form the conductive layers 211-217. In the present embodiment, the semiconductor capping layer 202 is preferably made of poly-silicon has a thickness substantially ranging from 300 Å to 500 Å.

Figure 2B:
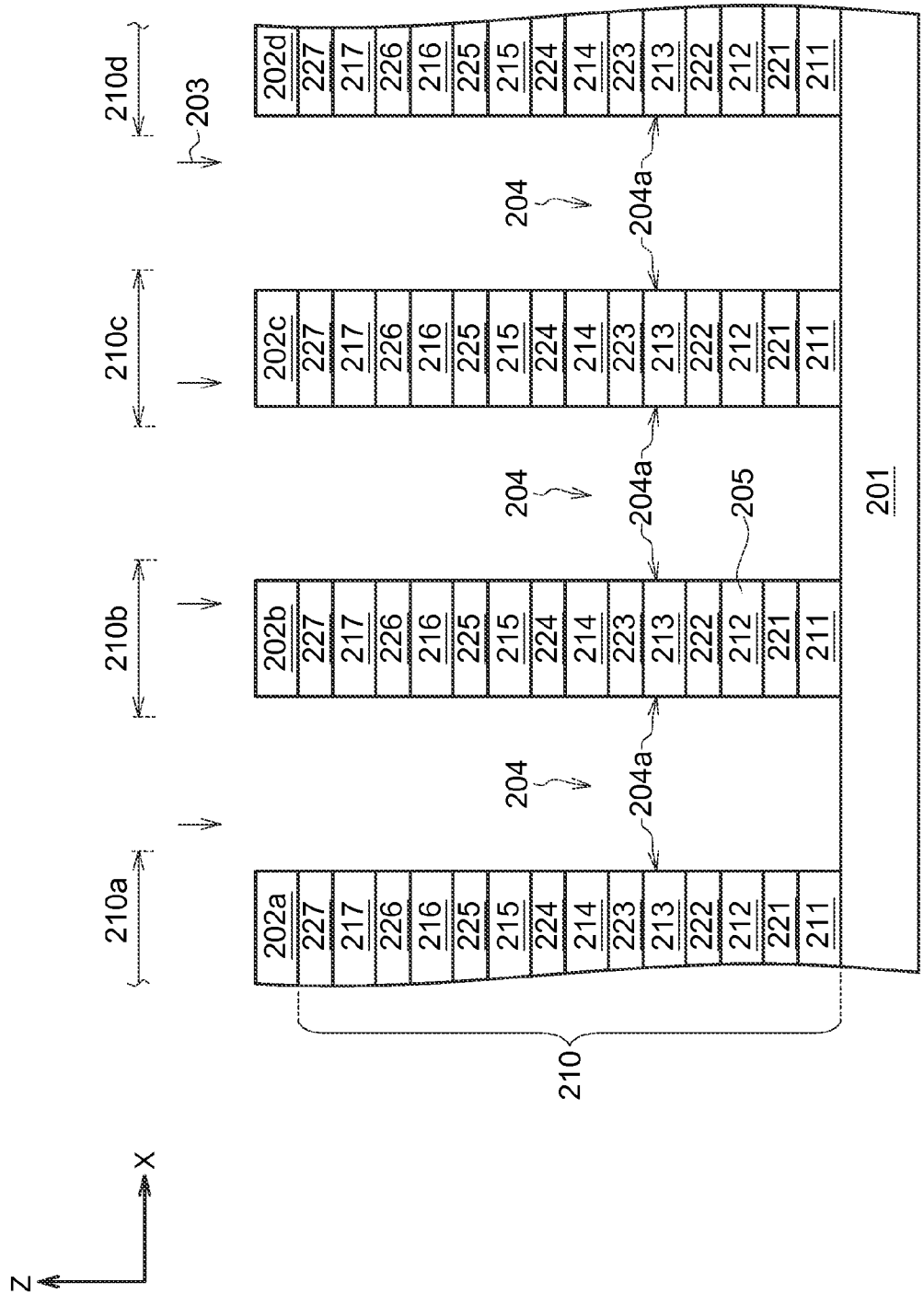

Subsequently, a process 203 for patterning the multi-layer stack 210 and the semiconductor capping layer 202 is performed to form a plurality of ridge-shaped stacks 210a and a patterned semiconductor capping layer 202 overlaying on the ridge-shaped stacks 210a (see FIG. 2B). In some embodiments of the present invention, the process for patterning the multi-layer stack 210 and the semiconductor capping layer 202 comprises steps of performing an anisotropic etching process, such as a reactive ion etching (RIE) process, to remove portions of the multi-layer stack 210 and the semiconductor capping layer 202 using a patterned hard mask layer (not shown) as an etching mask, to form a plurality of trenches 204 extending downwards along the Z-axle until regions of substrate 201 is exposed by the trenches 204, so as to divide the multi-layer stack 210 into a plurality of ridge-shaped stacks 210a, 210b, 210c, 210d and 210e extending along a Y-axle, and to divide the semiconductor capping layer 202 into a plurality of separated capping portions, such as capping portions 202a, 202b, 202c, 202d, and 202e.

In the present embodiment, each of the ridge-shaped stacks 210a, 210b, 210c, 210d or 210e comprises a portion of the conductive layers 211-217 each of which is cut into a conductive stripe 205. The capping portions 202a, 202b, 202c, 202d, and 202e of the patterned semiconductor capping layer 202 may cover on the ridge-shaped stacks 210a, 210b, 210c, 210d and 210e respectively.

Figure 2C:
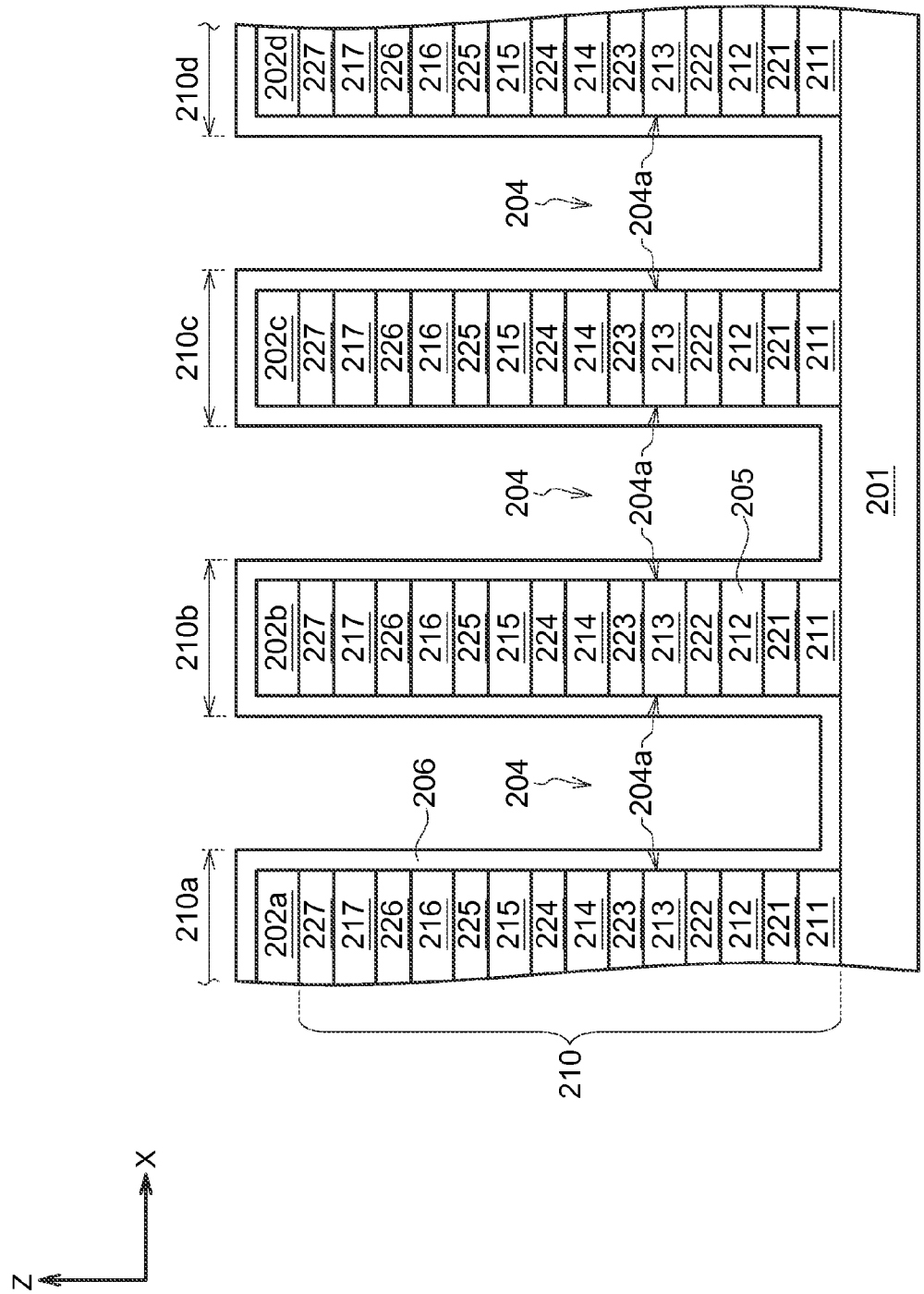

Thereafter, a memory layer 206 is formed on the ridge-shaped stacks 210a, 210b, 210c, 210d and 210e in a manner of covering on the capping portions 202a, 202b, 202c, 202d, and 202e as well as covering on the bottom (the portions of the substrate exposed from the trench 204) and the sidewalls of the trench 204 (see FIG. 2C). In some embodiments of the present invention, the memory material layer 206 may comprises an ONO structure (i.e. a composite layer including a silicon oxide layer, a silicon nitride layer, and a silicon oxide layer). Alternatively, in some other embodiments, the present, the memory material layer 206 may comprise (but not limited) a silicon oxide nitric oxide silicon (SONOS) structure. In the present embodiment, the memory material layer 206 is a composite layer with the ONO structure formed by a LPCVD process.

Figure 2D:
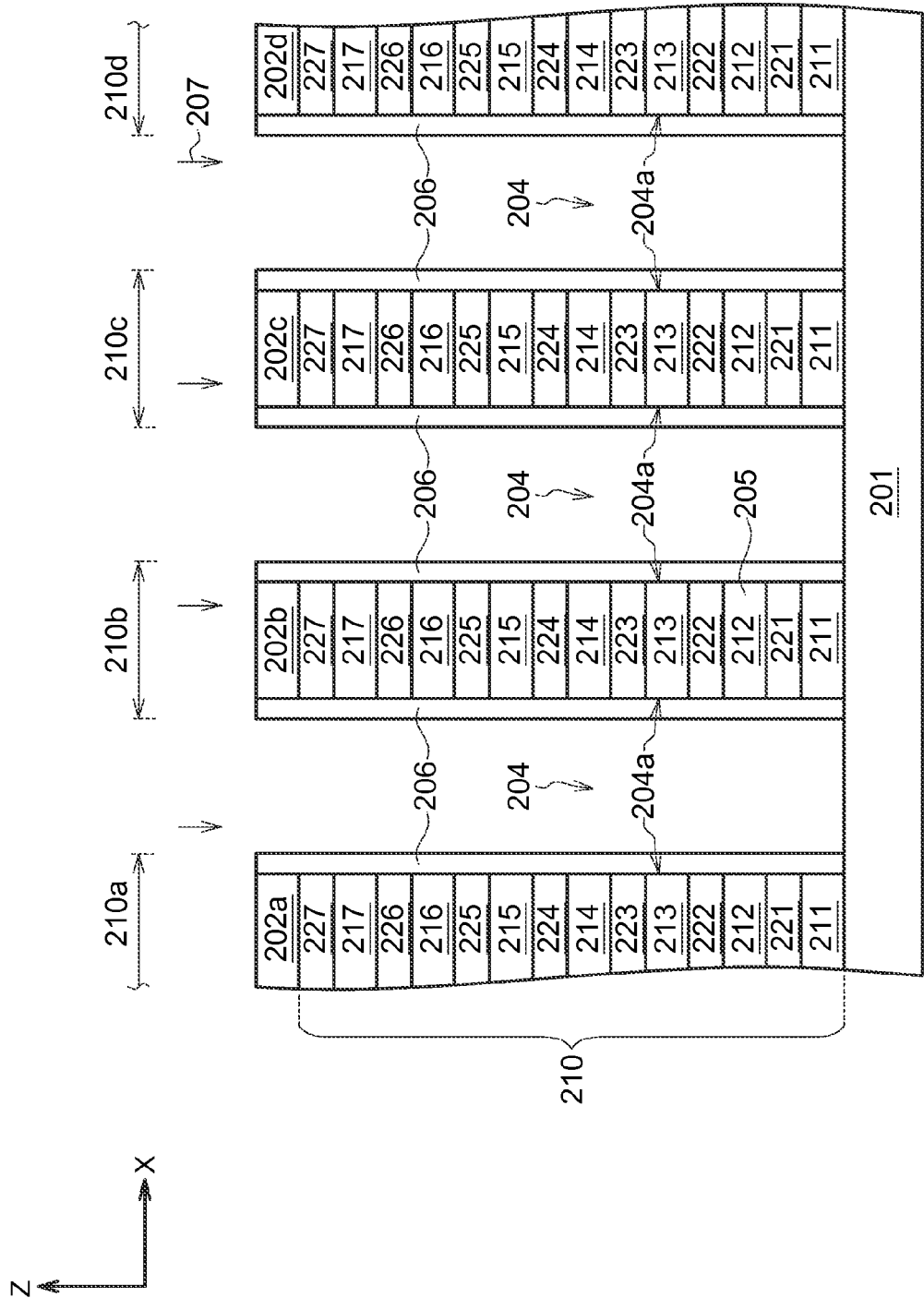

After the memory material layer 206 is formed, an etch process 207 is performed to remove portions of the memory layer 206 respectively overlaying on the capping portions 202a, 202b, 202c, 202d, and 202e and the bottom of the trench 204 to expose the patterned semiconductor capping layer 202 and to make the portions of the substrate 201 exposing through the trench 204 again (see FIG. 2D). In some embodiments of the present invention, the remaining memory material layer 206 preferably is merely disposed on the sidewalls of the trench 204.

Figure 2E:
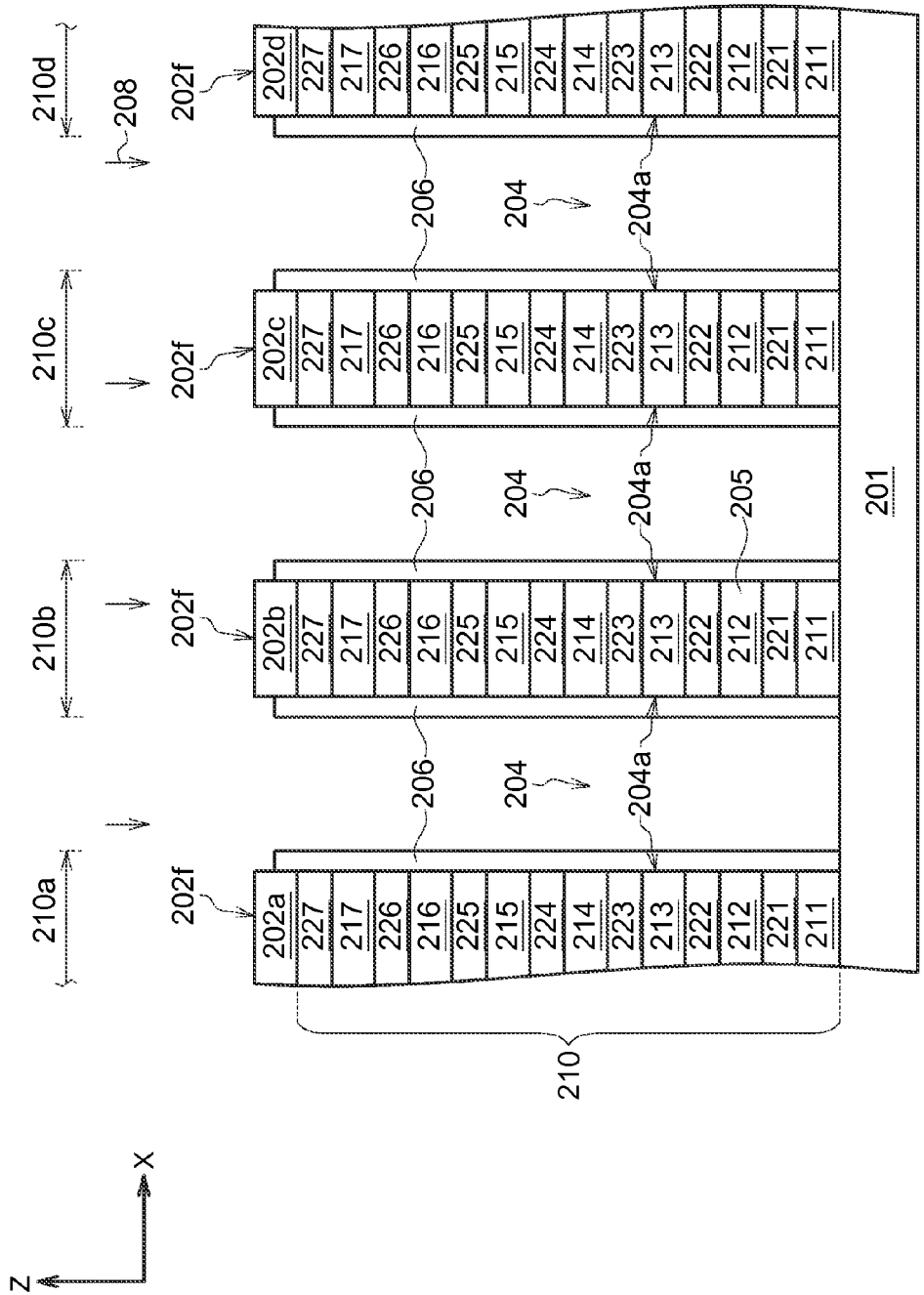

In some embodiments of the present invention, after removing the portions of the memory layer 206 respectively overlaying on the capping portions 202a, 202b, 202c, 202d, and 202e and the bottom of the trench 204, an optional etching back process 208 may be performed to further remove another portion of the memory layer 206 disposed adjacent to the opening of the trench 204, whereby the top surface of the remaining memory layer 206 may have a level lower than that of the top surface 202f of the pattern semiconductor capping layer 202 (see FIG. 2E).

Figure 2F:
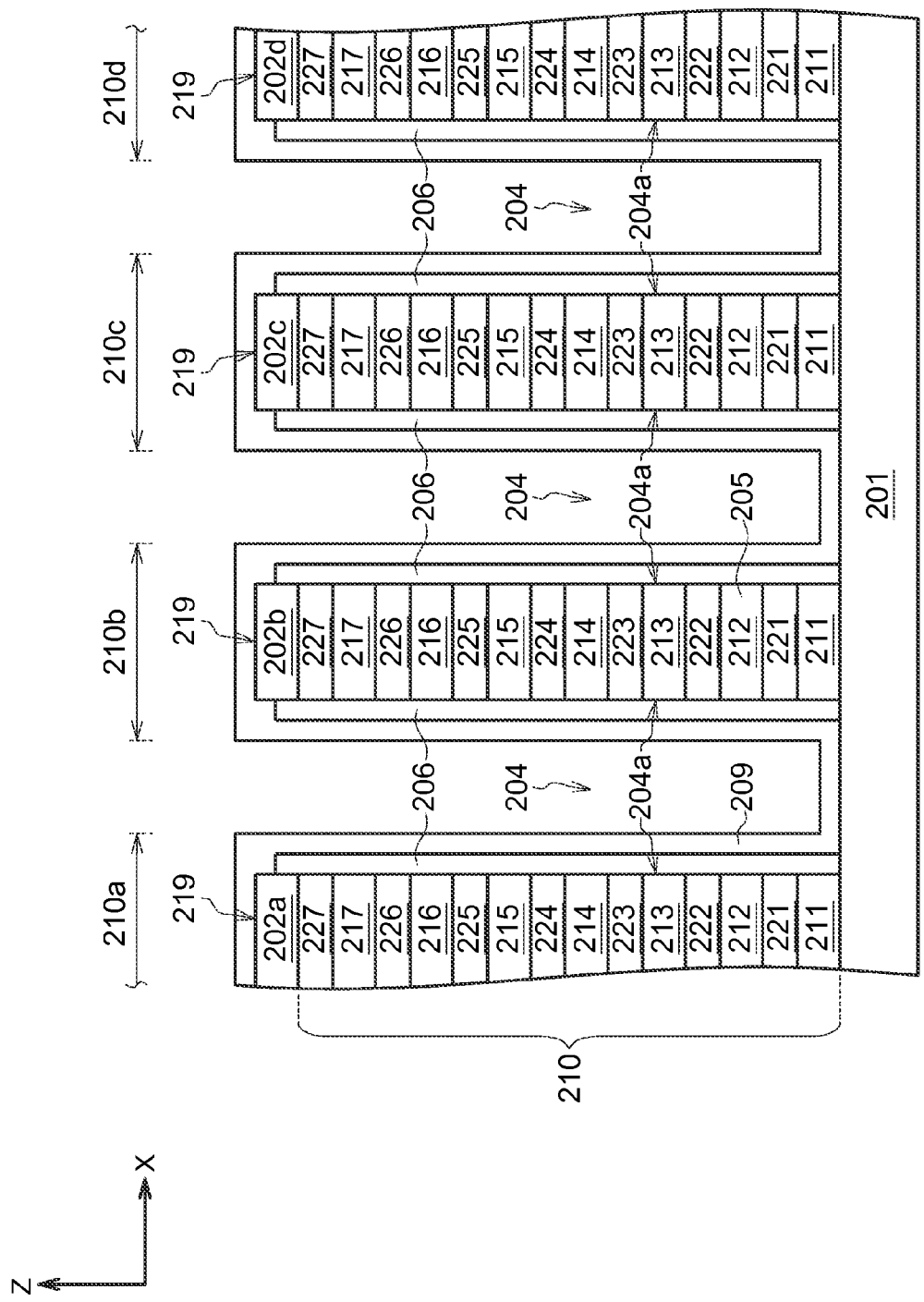
Figure 2G:
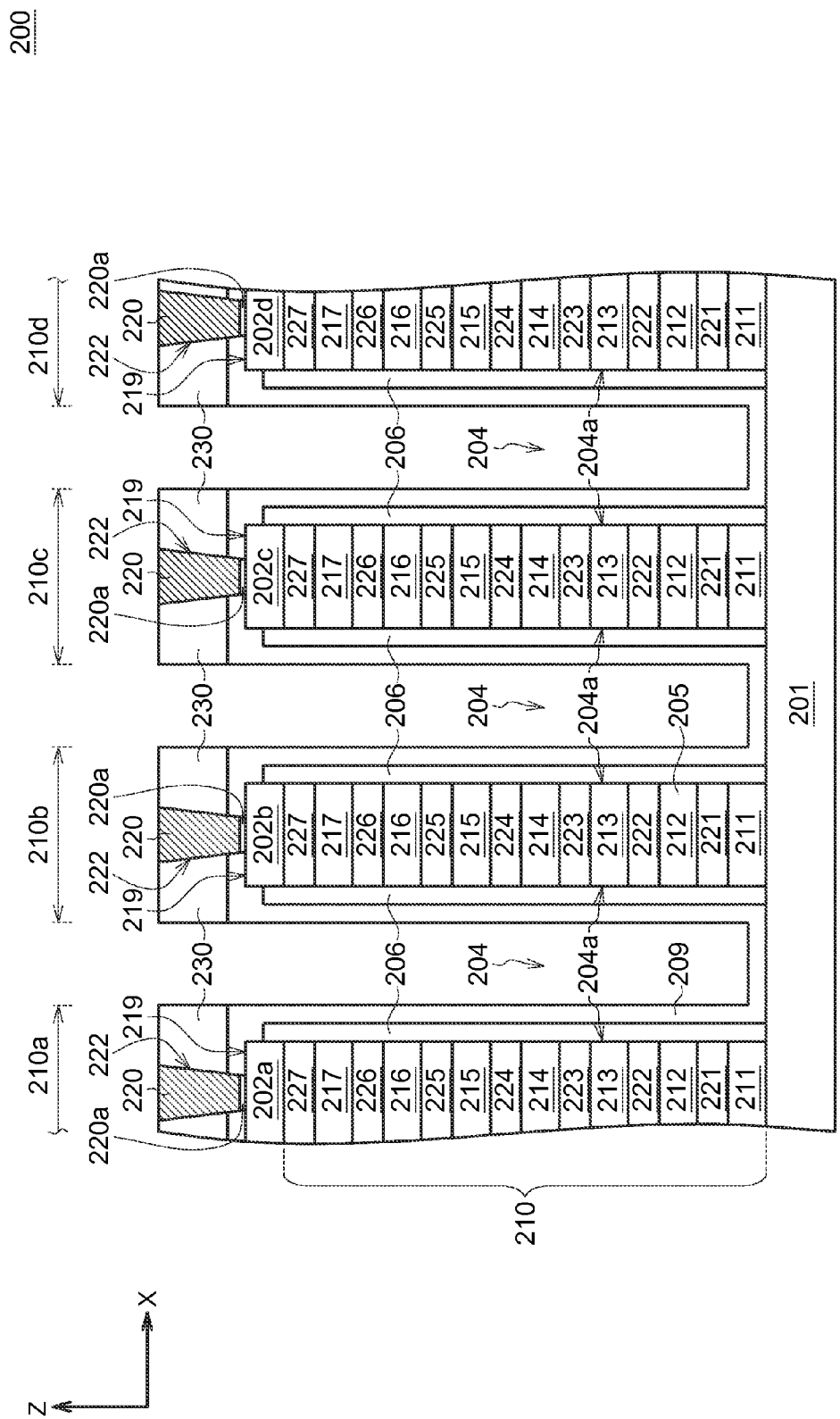

A conformal deposition process is then performed on the ridge-shaped stacks 210a, 210b, 210c, 210d and 210e to form a channel layer 209 blanketing over the memory material layer 206, the pattern semiconductor capping layer 202 and the bottom of the trenches 204 and making the top surface 202f of the pattern semiconductor capping layer 202 directly in contact with the channel layer 209 (see FIG. 2F). In some embodiments of the present invention, the channel layer 209 may be made of Si, Ge or other suitable semiconductor materials. The channel layer 209 has a thickness substantially ranging from 50 Å to 200 Å. In the present embodiment, the channel layer 209 and the patterned semiconductor capping layer 202 are both made of poly-silicon. Since the poly-silicon layers of the channel layer 209 and the patterned semiconductor capping layer 202 are formed by different deposition processes, thus there may exist a granular boundary 219 observable by an electron microscopy, such as a photoemission electron microscope (PEEM) at the interface between the channel layer 209 and the patterned semiconductor capping layer 202.

In addition, since the channel layer 209 is directly blanket over the memory material layer 206, the pattern semiconductor capping layer 202 and the bottom of the trenches 204, thus the capping portions 202a, 202b, 202c, 202d, and 202e of the pattern semiconductor capping layer 202 that are separately disposed on the ridge-shaped stacks 210a, 210b, 210c, 210d and 210e, in the present embodiment, can be electrically connected in series via the channel layer 209.

After the channel layer 209 is formed, a contact electrode 220 is formed on and directly in contact with the channel layer 209. In some embodiments of the present invention, the process for forming the contact electrode 220 comprises steps as follows: A dielectric layer 221 is firstly formed to overlay on the ridge-shaped stacks 210a, 210b, 210c, 210d and 210e. The dielectric layer 221 is then etched using the patterned semiconductor capping layer as an etching stop layer to form a plurality of openings 222 exposing the capping portions 202a, 202b, 202c, 202d, and 202e. A barrier layer 220a is next formed on the sidewalls and bottoms of the openings 222, and the openings 222 are filled with metal materials, such as Al, Cu or other suitable metal materials or alloy, to form the contact electrode 220 in the opening 222. Subsequently, a series of downstream processes may be carried out to implement the 3D memory device 200 (see FIG. 2G).

Since the channel layer 209 and the patterned semiconductor capping layer 202 directly in contact with each other are both made of poly-silicon, thus the contact portions of the channel layer 209 and the patterned semiconductor capping layer 202 can be integrated to form a contact area with a greater thickness, so as to provide a larger process window for forming the channel layer 209, in comparison with the prior art. Meanwhile, the contact area with greater thickness may provide more poly-silicon to form a silicide layer with smaller grains between the barrier layer 220a and the channel layer 209, whereby void formed in the silicide layer may be prevented and the resistance between the contact electrode 220 and the channel layer 209 may be decreased.

FIGS. 3A to 3E are cross-sectional views illustrating a method for fabricating a 3D NVM device 300 in accordance with another embodiment of the present invention. The method for fabricating the 3D NVM device 300 is similar to that for fabricating the 3D NVM device 200, except that the method further comprises steps for forming an optional semiconductor film 301. In order to provide a clear and concise description, the method for fabricating the 3D NVM device 300 starts at FIG. 3A that follows FIG. 2C, and the identical process prior to FIG. 2C will not redundantly described.

In some embodiments of the present invention, the semiconductor film 301 may be a semiconductor coating formed by a LPCVD process blanket over the memory layer 206. The semiconductor film 301 preferably may be also made of poly-silicon. The semiconductor film 301 has a thickness substantially ranging from 100 Å to 300 Å. In the present embodiment, the thickness of semiconductor film 301 is preferably about 100 Å.

Figure 3B:
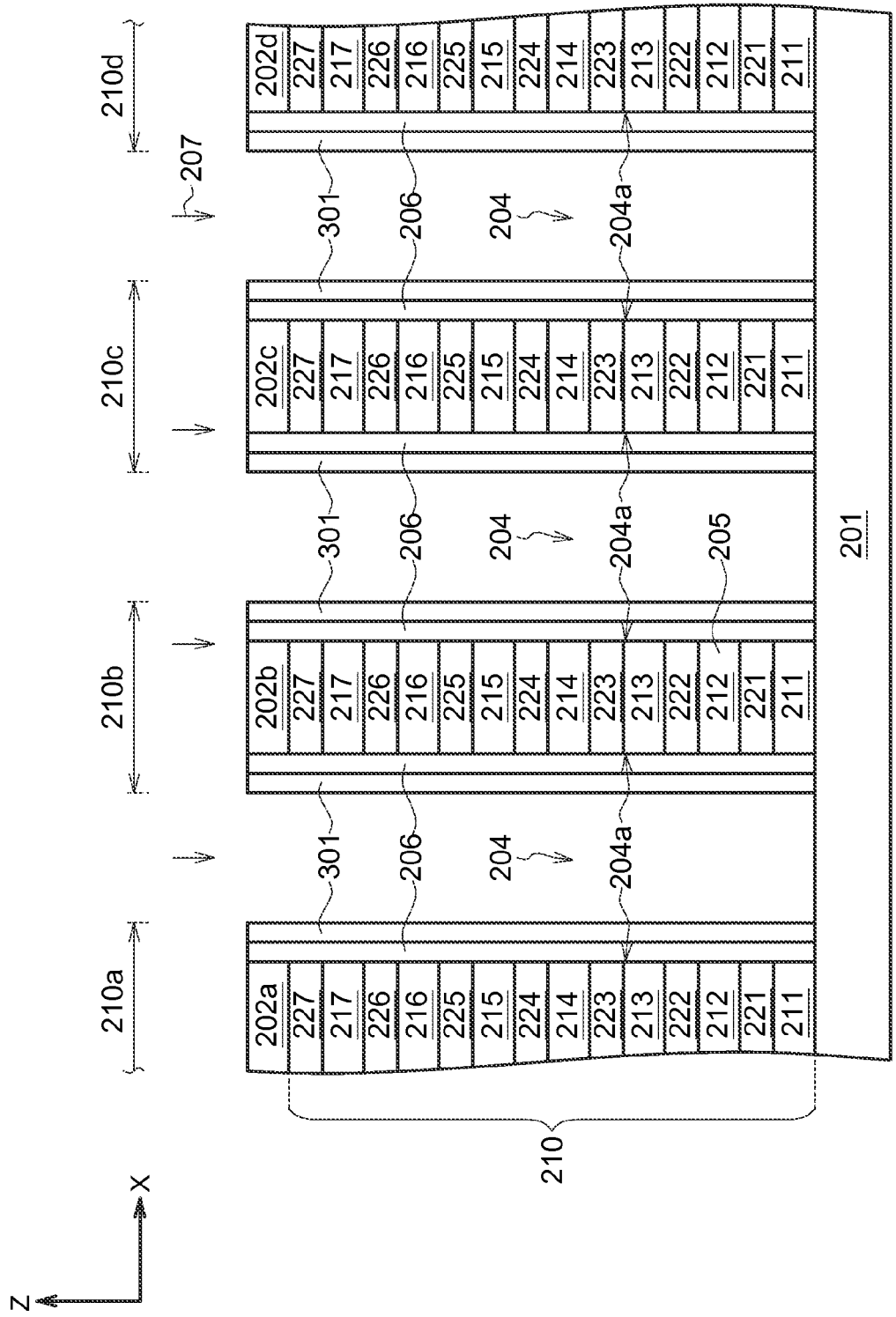
Figure 3C:
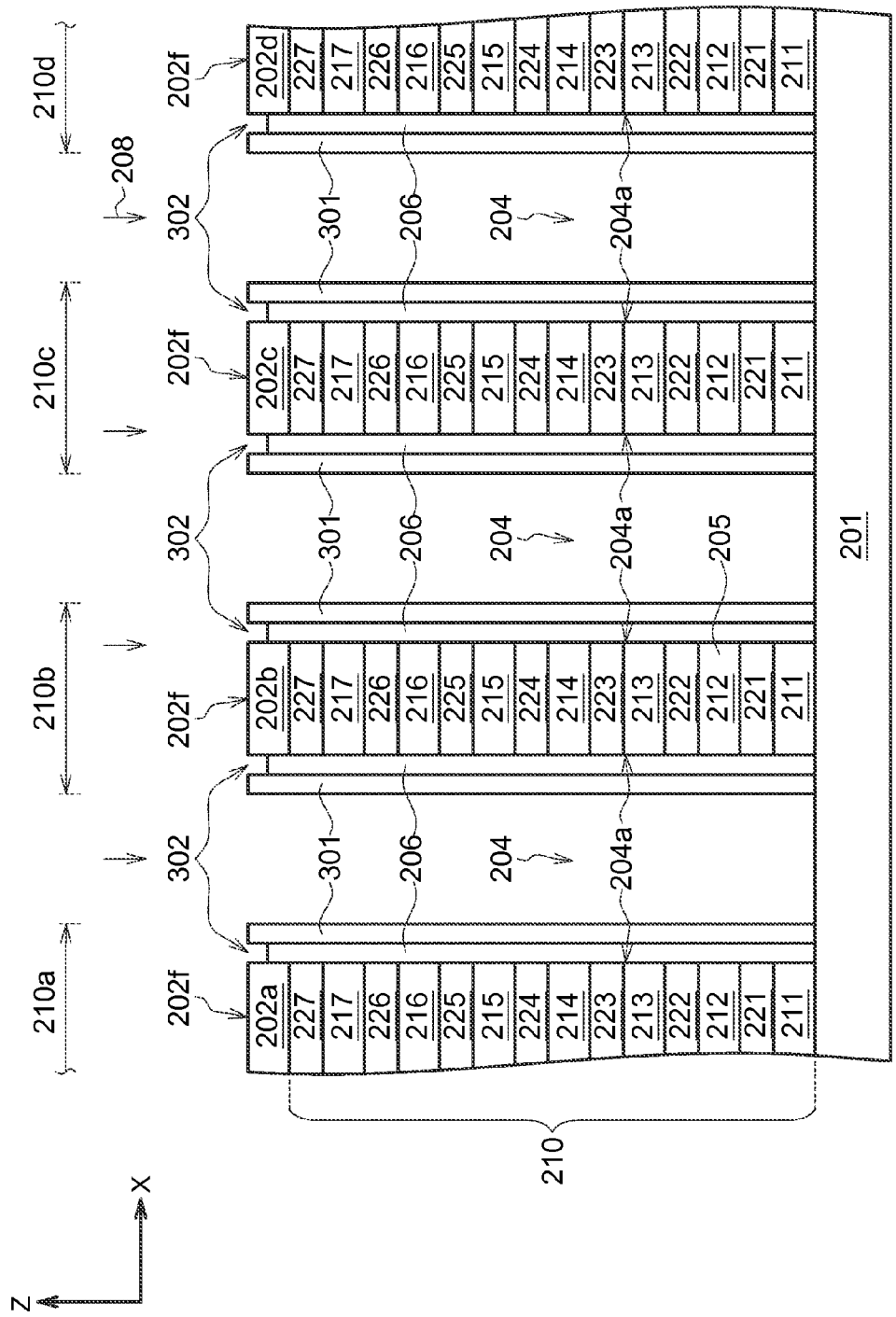
Figure 3D:
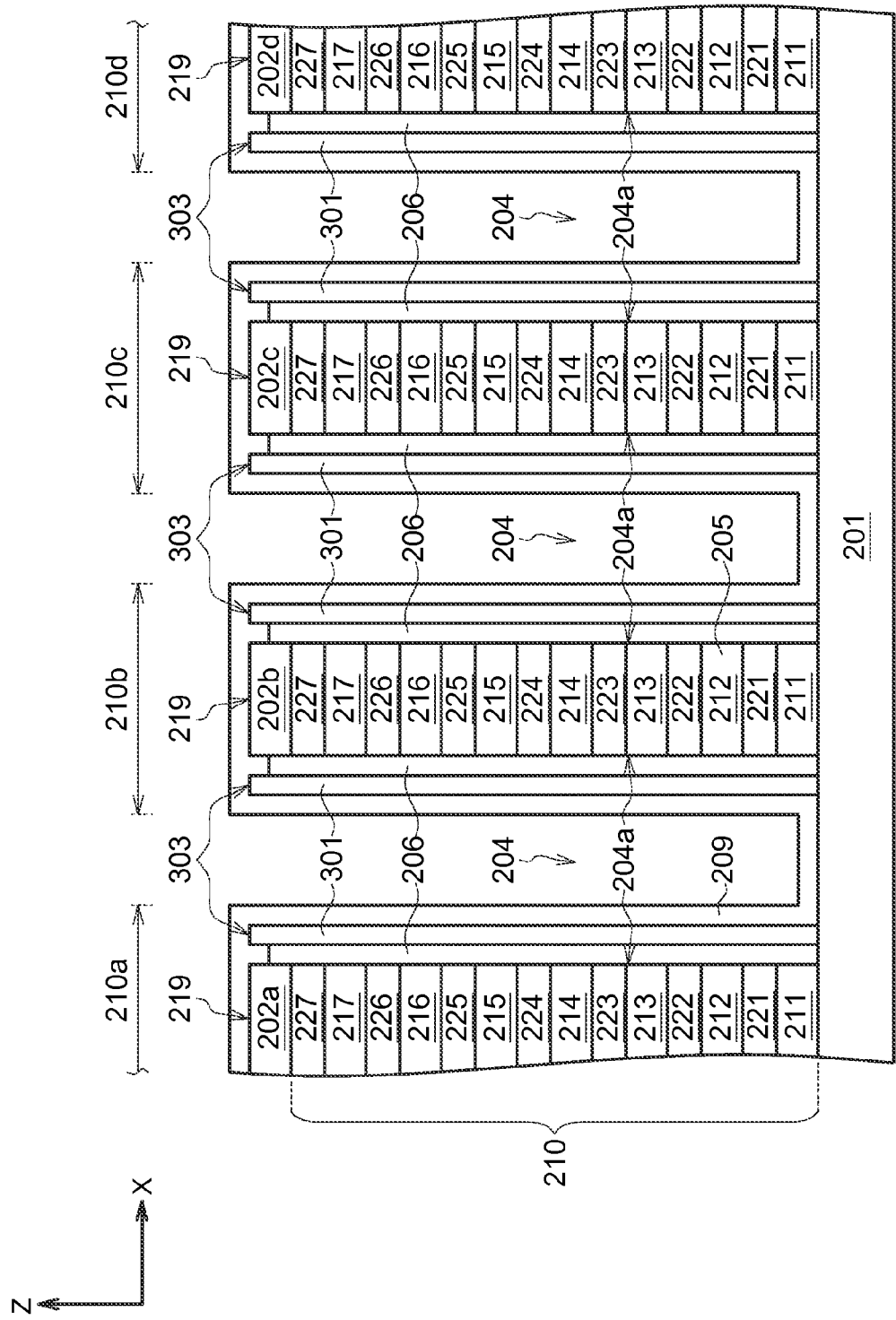
Figure 3E:
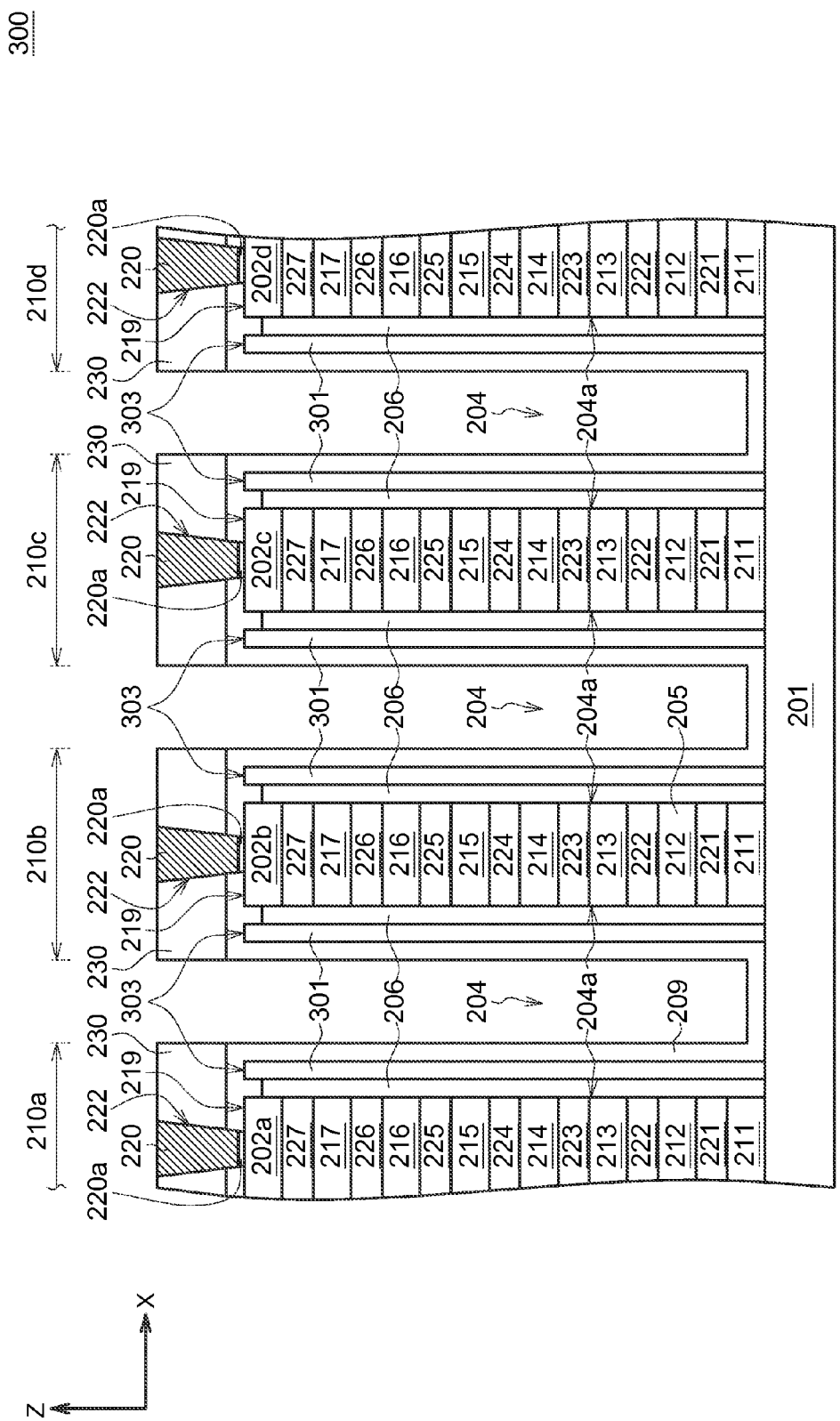

Thereafter, an etch process 207 is performed using the semiconductor film 301 as an etching stop layer to remove portions of the memory layer 206 and the semiconductor film 301 respectively overlaying on the capping portions 202a, 202b, 202c, 202d, and 202e and the bottom of the trench 204 to expose the patterned semiconductor capping layer 202 and to make the portions of the substrate 201 exposing through the trench 204 again (see FIG. 3B). In the present embodiment, the remaining memory material layer 206 is merely disposed on the sidewalls of the trench 204, and portions of the semiconductor film 301 disposed on the remaining memory material layer 206 are remained to form a spacer serving as a protection layer to prevent the remaining memory layer 206 disposed on the sidewalls of the trench 204 from being damaged by subsequent etching processes.

after removing the portions of the memory layer 206 respectively overlaying on the capping portions 202a, 202b, 202c, 202d, and 202e and the bottom of the trench 204, an optional etching back process 208 may be performed to further remove another portion of the memory layer 206 disposed adjacent to the opening of the trench 204, whereby the top surface of the remaining memory layer 206 may have a level lower than that of the top surface 202f of the pattern semiconductor capping layer 202 (see FIG. 3C). In the present embodiment, a plurality of recesses 302 are defined between the patterned semiconductor capping layer 202 and the semiconductor film 301.

A conformal deposition process is then performed on the ridge-shaped stacks 210a, 210b, 210c, 210d and 210e to form a channel layer 209 blanketing over the memory material layer 206, the remaining semiconductor film 301, the pattern semiconductor capping layer 202 and the bottom of the trenches 204 and making the top surface 202f of the pattern semiconductor capping layer 202 and the remaining semiconductor film 301 directly in contact with the channel layer 209. As a result, the capping portions 202a, 202b, 202c, 202d, and 202e of the pattern semiconductor capping layer 202 that are separately disposed on the ridge-shaped stacks 210a, 210b, 210c, 210d and 210e, in the present embodiment, can be electrically connected in series via the channel layer 209 (see FIG. 3D).

Since the channel layer 209, the semiconductor film 301 and the patterned semiconductor capping layer 202 are made of poly-silicon formed by different deposition processes, thus there may exist granular boundaries 219 and 303 observable by an electron microscopy, such as a PEEM, respectively at the interface between the channel layer 209 and the patterned semiconductor capping layer 202 and the interface between the channel layer 209 and the semiconductor film 301. In the present embodiment, the granular boundaries 219 and 303 may have a U shape.

After the channel layer 209 is formed, a contact electrode 220 is formed on and directly in contact with the channel layer 209. In some embodiments of the present invention, the process for forming the contact electrode 220 comprises steps as follows: A dielectric layer 221 is firstly formed to overlay on the ridge-shaped stacks 210a, 210b, 210c, 210d and 210e. The dielectric layer 221 is then etched using the patterned semiconductor capping layer as an etching stop layer to form a plurality of openings 222 exposing the capping portions 202a, 202b, 202c, 202d, and 202e. A barrier layer 220a is next formed on the sidewalls and bottoms of the openings 222, and the openings 222 are filled with metal materials, such as Al, Cu or other suitable metal materials or alloy, to form the contact electrode 220 in the opening 222. Subsequently, a series of downstream processes may be carried out to implement the 3D memory device 300 (see FIG. 3E).

Since the channel layer 209 and the patterned semiconductor capping layer 202 directly in contact with each other are both made of poly-silicon, thus the contact portions of the channel layer 209 and the patterned semiconductor capping layer 202 can be integrated to form a contact area with a greater thickness, so as to provide a larger process window for forming the channel layer 209, in comparison with the prior art. Meanwhile, the contact area with greater thickness may provide more poly-silicon to form a silicide layer with smaller grains between the barrier layer 220a and the channel layer 209, whereby void formed in the silicide layer may be prevented and the resistance between the contact electrode 220 and the channel layer 209 may be decreased.

In accordance with the aforementioned embodiments of the present invention, a 3D memory device and a method for fabricating the same are provided. During the process for forming the 3D memory device, an additional semiconductor capping layer is firstly formed on a multi-layers stacking structure, and at least on trench is then formed to divide the semiconductor capping layer and the multi-layers stacking structure into a plurality of ridge-shaped stacks. Subsequently, a memory layer and a channel layer are formed in sequence to define a plurality of memory cells having a vertical string electrical connection on sidewalls of the trench, wherein the semiconductor capping layer is directly in contact with the channel layer.

Since the semiconductor capping layer can be integrated with the portion of the channel layer overlaying on top surfaces of the ridge-shaped stacks to form a contact area with a greater thickness, thus a greater process window can be provided allowing a metal contact subsequently formed thereon. Meanwhile, the contact area with greater thickness may provide more poly-silicon to form a silicide layer with smaller grains between the contact area and the metal contact, whereby void formed in the silicide layer may be prevented and the resistance between the metal contact and the channel layer may be decreased. In addition, because the semiconductor capping layer merely formed on the top surfaces of the ridge-shaped stacks, the integration of the semiconductor capping layer and the channel layer would not increase the channel thicknesses of the memory cells that are formed on the sidewalls of the trench. In other words, forming the semiconductor capping layer to provide a greater process window to the metal contact would not deteriorate the control efficiency of the 3D memory device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a patterned multi-layers stacking structure, formed on a substrate and having at least one trench used to define a plurality of ridge-shaped stacks comprising at least one conductive strip in the patterned multi-layers stacking structure;
   a semiconductor capping layer, directly in contact with and covering the ridge-shaped stacks;
   a memory layer, covering on sidewalls of the trench; and
   a channel layer, covering on the memory layer, a side surface and a top surface of the semiconductor capping layer and a bottom of the trench, wherein the channel layer is directly in contact with the semiconductor capping layer.

2. The memory device according to claim 1, further comprising a contact electrode disposed on the semiconductor capping layer and directly in contact with the channel layer.

3. The memory device according to claim 1, wherein the patterned multi-layers stacking structure comprises a plurality of insulation layers and a plurality of conductive layers alternatively stacked with each other.

4. The memory device according to claim 1, wherein the semiconductor capping layer and the channel layer both comprise poly-silicon, and there exists a granular boundary at an interface between the channel layer and the semiconductor capping layer.

5. The memory device according to claim 4, further comprising a semiconductor spacer disposed between the channel layer and the memory layer and directly in contact with the channel layer.

6. The memory device according to claim 5, wherein the semiconductor spacer and the channel layer both comprise poly-silicon, and there exists a granular boundary at an interface between the channel layer and the semiconductor spacer.

7. The memory device according to claim 5, wherein the semiconductor spacer has a thickness substantially ranging from 100 Å to 300 Å.

8. The memory device according to claim 1, wherein the semiconductor capping layer comprises a first capping portion and a second capping portion respectively disposed on two of the ridge-shaped stacks, and the first capping portion and the second capping portion are electrically connected with each other by the channel layer.

9. The memory device according to claim 1, wherein the semiconductor capping layer has a thickness substantially ranging from 300 Å to 500 Å.

10. A method for fabricating a memory device, comprising:
    providing a multi-layers stacking structure on a substrate;
    forming a semiconductor capping layer directly in contact with and covering the multi-layers stacking structure;
    patterning the multi-layers stacking structure and the semiconductor capping layer to form at least one trench to define a plurality of ridge-shaped stacks each of which comprises at least one conductive strip;
    forming memory layer covering on the semiconductor capping layer as well as covering on sidewalls and a bottom of the trench;

removing portions of the memory layer disposed on the semiconductor capping layer and the bottom of the trench; and forming a channel layer covering on the memory layer, a side surface and a top surface of the semiconductor capping layer and the bottom of the trench, whereby the channel layer is directly in contact with the semiconductor capping layer.

11. The method according to claim 10, further comprising a contact electrode disposed on the semiconductor capping layer and directly in contact with the channel layer.

12. The method according to claim 10, wherein the semiconductor capping layer is formed on a top-most insulation layer of the multi-layers stacking structure.

13. The method according to claim 10, further comprising steps of forming a semiconductor film prior to the process of removing portions of the memory layer.

14. The method according to claim 13, wherein the process of removing portions of the memory layer comprises removing portions of the memory layer and the semiconductor film that are disposed on the semiconductor capping layer as well as coving on the bottom of the trench, so as to form a semiconductor spacer on the sidewalls of the trench.

15. The method according to claim 14, wherein the semiconductor spacer and the channel layer both comprise poly-silicon, and there exists a granular boundary at an interface between the channel layer and the semiconductor spacer.

16. The method according to claim 14, wherein the semiconductor spacer has a thickness substantially ranging from 100 Å to 300 Å.

17. The method according to claim 10, further comprising an etch back process after the process of removing portions of the memory layer is carried out.

18. The method according to claim 10, wherein the semiconductor capping layer and the channel layer both comprise poly-silicon, and there exists a granular boundary at an interface between the channel layer and the semiconductor capping layer.

19. The method according to claim 10, wherein the process of forming the memory layer comprises steps of performing a conformal deposition process to form a poly-silicon layer blanket over the memory layer, the bottom and the sidewalls of the trench and a first capping portion and a second capping portion of the semiconductor capping layer respectively disposed on two of the ridge-shaped stacks, so as to electrically connect the first capping portion and the second capping portion with the channel layer.

20. The method according to claim 10, wherein the semiconductor capping layer has a thickness substantially ranging from 300 Å to 500 Å.

* * * * *